United States Patent [19]

Horisawa et al.

[11] Patent Number: 5,248,950
[45] Date of Patent: Sep. 28, 1993

[54] HIGH FREQUENCY SIGNAL PROCESSING APPARATUS WITH BIASING ARRANGEMENT

[75] Inventors: Shozo Horisawa, Chiba; Hiroyuki Mita, Kanagawa, both of Japan

[73] Assignee: Sony Corporation, Tokyo, Japan

[21] Appl. No.: 868,242

[22] Filed: Apr. 14, 1992

[30] Foreign Application Priority Data

Apr. 24, 1991 [JP] Japan .................. 3-92489

[51] Int. Cl.$^5$ .................................. H01P 1/00
[52] U.S. Cl. ................... 333/246; 330/277; 330/296; 333/204
[58] Field of Search ............ 333/12, 104, 204, 238, 333/246, 218; 330/277, 296

[56] References Cited

U.S. PATENT DOCUMENTS

| 4,266,208 | 5/1981 | Cornish | 333/218 |
| 4,305,052 | 12/1981 | Baril et al. | 333/246 X |
| 4,801,905 | 1/1989 | Becker | 333/238 |

Primary Examiner—Paul Gensler
Attorney, Agent, or Firm—Lewis H. Eslinger; Jay H. Maioli

[57] ABSTRACT

A high frequency signal processing apparatus having signal line patterns formed on the upper surface of a dielectric substrate has a bias line pattern that extends from each of the signal line patterns. The bias line pattern has a first portion formed on the upper surface of the dielectric substrate, a second portion formed on the lower surface of the dielectric substrate, and a conductor extending through the dielectric substrate for providing an electrical connection between the first and second portions of the bias line pattern. A trap pattern is formed on the lower surface of the dielectric substrate and is connected to the second portion of the bias line pattern at a position spaced a predetermined distance away from the corresponding one of the signal line patterns. The predetermined distance is substantially equal to an odd number multiplied by $T \cdot \lambda/4$ where $T$ and $\lambda$ are the periodicity and wave-length of the high frequency signal to be processed. A grounded pattern is also formed on the first surface of the dielectric substrate.

8 Claims, 3 Drawing Sheets

HIGH FREQUENCY SIGNAL PROCESSING APPARATUS WITH BIASING ARRANGEMENT

BACKGROUND OF THE INVENTION

This invention relates to an apparatus for processing a high frequency signal and, more particularly to a high frequency signal processing apparatus of high density layout design.

High frequency signal processing apparatus of high density layout design include signal-transmission and power-transmission patterns formed on a dielectric substrate to operate signal processors placed on the dielectric substrate. In order to provide good isolation of the signal processors from the associated power source, it is the current practice to form a trap pattern on the dielectric substrate for connection to each of the power transmission patterns. For this purpose, however, it is required to connect the trap pattern to the associated power transmission pattern at a position spaced away from the associated signal transmission pattern a predetermined distance substantially equal to T·λ/4 where T and λ are the periodicity and wave length of the high frequency signal to be processed. This requirement results in a limited degree of freedom for layout design.

SUMMARY OF THE INVENTION

It is a main object of the invention to provide a high frequency signal processing apparatus which can ensure a higher degree of freedom for layout design.

Another object of the invention is to provide a high frequency signal processing apparatus of a higher density.

Still another object of the invention is to provide a high frequency signal processing apparatus which can ensure freedom from noise and disturbance.

There is provided, in accordance with the invention, an apparatus for processing a high frequency signal having a periodicity T and a wave length λ. The apparatus comprises a dielectric substrate having first and second surfaces opposite to each other, signal line patterns formed on the first surface of the dielectric substrate for communication of the high frequency signal, and a bias line pattern extending from each of the signal line patterns. The bias line pattern has a first portion formed on the first surface of the dielectric substrate, a second portion formed on the second surface of the dielectric substrate, and a conductor extending through the dielectric substrate for providing an electrical connection between the first and second portions of the bias line pattern. A trap pattern is formed on the second surface of the dielectric substrate and connected to the second portion of the bias line pattern at a position spaced away from the corresponding one of the signal line patterns a predetermined distance substantially equal to an odd number multiplied by T·λ/4. The apparatus also includes a grounded pattern formed on the first surface of the dielectric substrate.

In another aspect of the invention, there is provided an apparatus for processing a high frequency signal having a periodicity T and a wave length λ. The apparatus comprises a dielectric substrate having first and second surfaces opposite to each other, at least one signal processor for processing the high frequency signal to produce a processed signal, a first signal line pattern formed on the first surface of the dielectric substrate for coupling the high frequency signal to the signal processor, a second signal line pattern formed on the first surface of the dielectric substrate for transmitting the processed signal from the signal processor, a first bias line pattern extending from the first signal line pattern for coupling the first signal line pattern to a first bias voltage, and a second bias line pattern extending from the second signal line pattern for coupling the second signal line pattern to a second bias voltage. The first bias line pattern has a first portion formed on the first surface of the dielectric substrate, a second portion formed on the second surface of the dielectric substrate, and a conductor extending through the dielectric substrate for providing an electrical connection between the first and second portions of the first bias line pattern. Similarly, the second bias line pattern has a fourth portion formed on the first surface of the dielectric substrate, a fifth portion formed on the second surface of the dielectric substrate, and a conductor extending through the dielectric substrate for providing an electrical connection between the fourth and fifth portions of the second bias line pattern. A first trap pattern is formed on the second surface of the dielectric substrate and connected to the second portion of the first bias line pattern at a position spaced away from the first signal line pattern a predetermined distance substantially equal to an odd number multiplied by T·λ/4. A second trap pattern is formed on the second surface of the dielectric substrate and connected to the fifth portion of the second bias line pattern at a position spaced the predetermined distance away from the second signal line pattern. The apparatus also includes a grounded pattern formed on the first surface of the dielectric substrate.

BRIEF DESCRIPTION OF THE DRAWINGS

This invention will be described in greater detail by reference to the following description taken in connection with the accompanying drawings, in which.

DETAILED DESCRIPTION OF THE INVENTION

Figure 6:
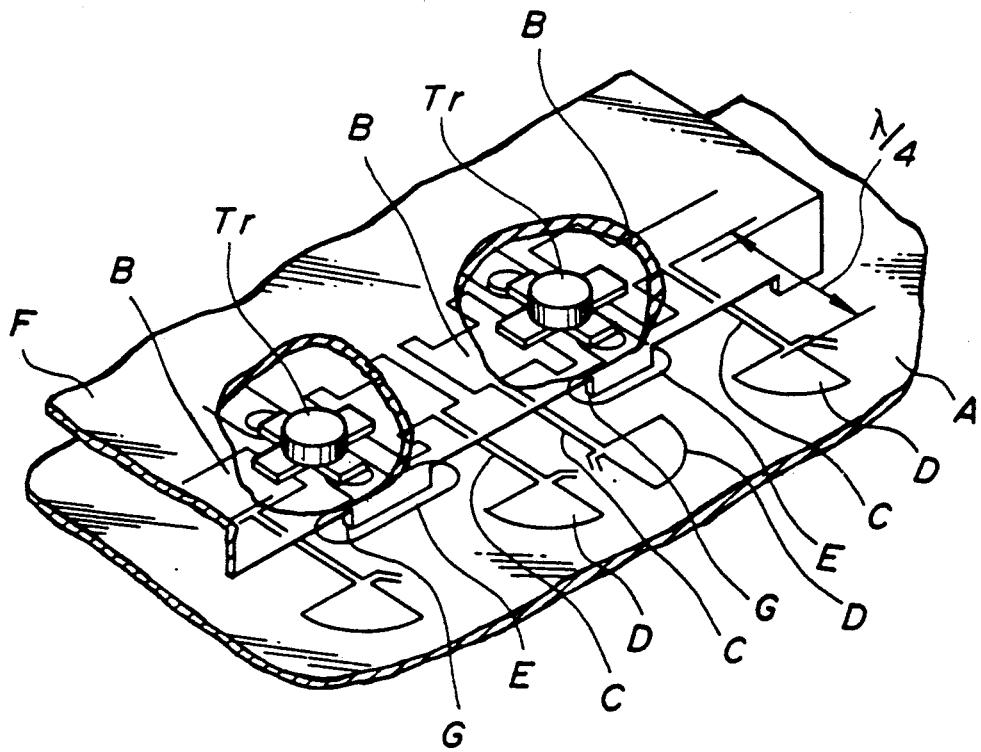
FIG. 6 is a fragmentary perspective view showing a prior art high frequency amplifier.

Prior to the description of the preferred embodiment of the invention, the prior art high frequency signal processing apparatus of FIG. 6 is briefly described in order to specifically point out the difficulties attendant thereon.

In FIG. 6, the prior art high frequency amplifier includes a dielectric substrate A having signal-line and bias-line patterns B and C formed on its upper surface. The bias line patterns C extend from the respective signal line patterns B. A plurality of transistors Tr are placed on the upper surface of the dielectric substrate A. Each of the transistors Tr has a grounded source terminal, a drain terminal connected to one of the signal line patterns B, and a gate terminal connected to another signal line pattern B. The one signal line pattern B is coupled through the associated bias line pattern C to a first bias voltage, whereas the other signal line pattern B is coupled through the associated bias line pattern C to a second bias voltage so as to operate the transistor Tr. A trap pattern D is connected to each of the bias line patterns C at a position spaced away from the associated signal line pattern B a predetermined distance substantially equal to $T\cdot\lambda/4$ where T and $\lambda$ are the periodicity and wave-length of the high frequency signal to be amplified in the high frequency amplifier. The dielectric substrate A also has grounded patterns E formed in spaced relation with each other on the upper surface thereof. A shield casing F is placed to cover the transistors Tr. The shield casing F has side walls formed with cutouts G so that the side walls have end surface portions contacting with the respective grounded patterns E and end surface portions spaced from the dielectric substrate A.

With the above arrangement, each of the bias line patterns C has a high impedance and a short circuit provided at the predetermined distance ($T\cdot\lambda/4$) away from the associated signal line pattern B. This is effective to prevent noise introduction onto the high frequency signal to be amplified. However, it has been found that there is only a small degree of freedom for the layout design. Furthermore, the transistors Tr are not isolated from the exterior of the shield casing F and they are subject to disturbance due to local leakage.

Figure 1:
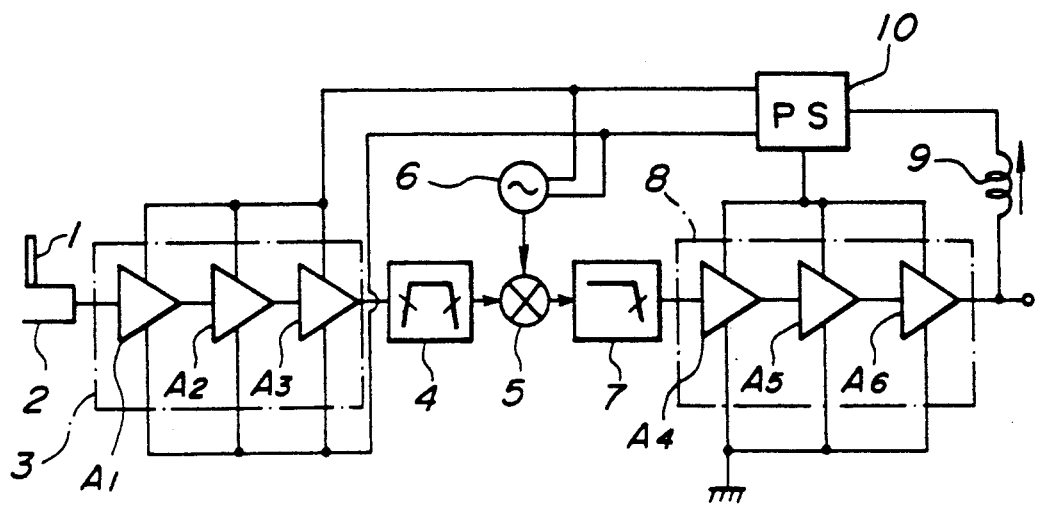
FIG. 1 is a schematic block diagram showing a low noise converter used in a satellite broadcasting receiver to which the invention is applied.

Referring to FIG. 1, there is shown a schematic block diagram of a low noise converter circuit for use in a satellite broadcasting receiver to which the invention is applied. The low noise converter circuit receives a high frequency signal through a probe 1. The received signal is then introduced, through a signal line 2 having a resistance of 50Ω, to a high frequency amplifier section 3. The high frequency amplifier section 3 is taken in the form of a three-stage amplifier circuit having three high frequency amplifiers A1, A2 and A3. The output of the high frequency amplifier section 3 is coupled through a band pass filter 4 to a mixer 5. The mixer 5 also receives a local signal from a local oscillator 6 to convert the high frequency signal into an intermediate frequency signal. This intermediate frequency signal is then fed through a low pass filter 7 to an intermediate frequency amplifier section 8. The intermediate frequency amplifier section 8 is taken in the form of a three-stage amplifier circuit having three intermediate frequency amplifiers A4, A5 and A6. The output of the intermediate frequency amplifier section 8 is coupled to an FM demodulator (not shown) and also through a choke 9 to a power source (PS) 10.

Figure 2:
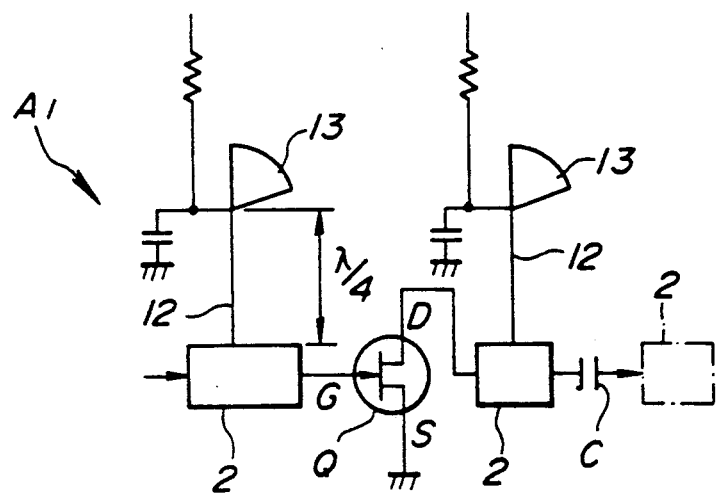
FIG. 2 is a circuit diagram showing a high frequency amplifier used in the low noise converter.

Referring to FIG. 2, the high frequency amplifier A1 includes a field effect transistor Q having a source electrode S, a drain electrode D and a gate electrode G. The source electrode S is grounded. The gate electrode G receives the high frequency signal introduced through the signal line 2 having a resistance of 50Ω. The gate electrode G receives a negative bias voltage through a bias line 12. The drain terminal D is connected to another signal line 2 having resistance of 50Ω which in turn is connected through a capacitor C to still another signal line 2 having a resistance of 50Ω included in the next stage of the high frequency amplifier section 3. The drain electrode D receives a positive bias voltage through another bias line 12. Trap stubs 13 are connected to the respective bias lines 12 in order to prevent the bias voltages from introducing noise on the high frequency signal.

Figure 3:
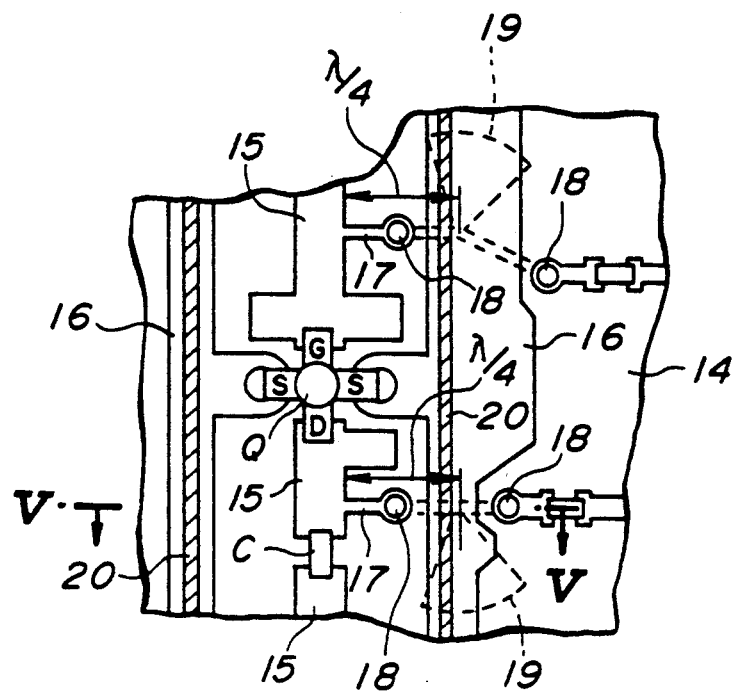
FIG. 3 is a fragmentary top plan view showing the high frequency amplifier placed on a dielectric substrate.
Figure 4:
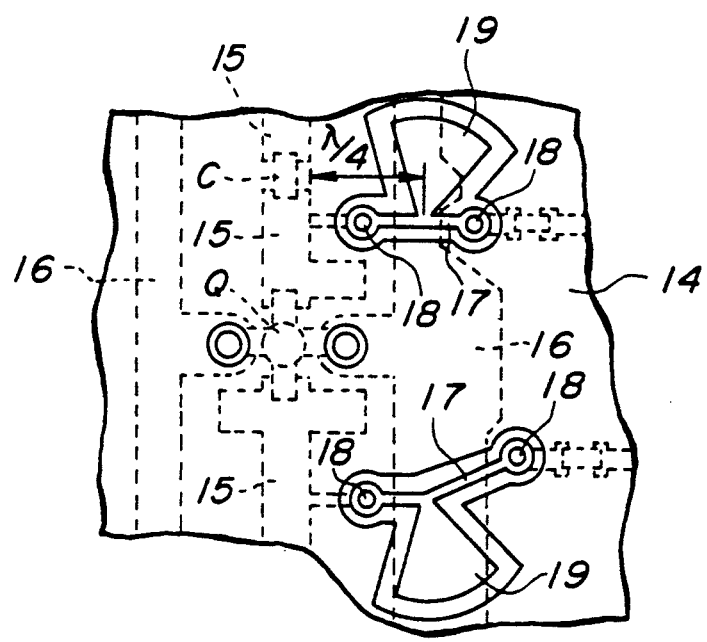
FIG. 4 is a fragmentary bottom plan view of the dielectric substrate.

Referring to FIGS. 3 and 4, the field effect transistor Q is placed on the upper surface of a high dielectric substrate 14 having signal-line and bias-line patterns 15 and 17 formed on its upper surface. The drain electrode D of the field effect transistor Q is connected to one of the signal line patterns 15 and the gate electrode G is connected to another signal line pattern 15. The signal line patterns 15 constitute the respective signal lines 2 having a resistance of 50Ω. The bias line patterns, which extend from the respective signal line patterns 15, constitute the respective bias lines 12. The source electrodes S of the field effect transistor Q are connected to grounded patterns 16.

Figure 5:
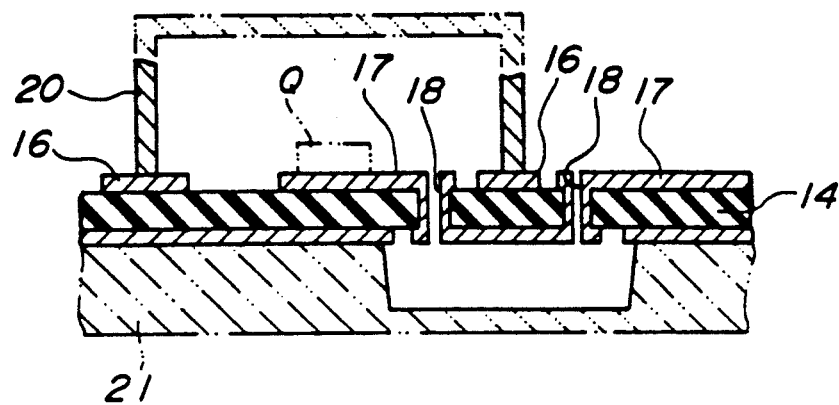
FIG. 5 is a fragmentary sectional view taken along the line V—V of FIG. 3.

As best shown in FIG. 5, each of the bias line patterns 17 has a first portion formed on the upper surface of the dielectric substrate 14, a second portion formed on the lower surface of the dielectric substrate 14, and a third portion formed on the upper surface of the dielectric substrate 14. The first portion is connected at its one end to the signal line pattern 15 and connected at the other end thereof to one end of the second portion through a conductor that extends through a through-hole 18 formed in the dielectric substrate 14. The other end of the second portion is connected to one end of the third portion through another conductor extending through the dielectric substrate 14. The other end of the third portion is connected to a source of bias voltage. A trap pattern 19 is formed on the lower surface of the dielectric substrate 14 and is connected to the second portion of the bias line pattern 17 at a position spaced away from the signal line pattern 15 at a predetermined distance substantially equal to $T\cdot\lambda/4$ where T is the periodicity of the high frequency signal and $\lambda$ is the wave length of the high frequency signal. The trap pattern 19 has a microline strip configuration and it constitutes the trap stub 13. A shield casing 20 is placed to cover the field effect transistor Q and it has an end surface held in contact with the grounded pattern 16 formed to surround the field effect transistor Q over the entire area of the end surface of the shield casing 20. Thus, the shield casing 20 is simple in structure and is effective to provide good isolation of the field effect transistor Q from the exterior of the shield casing 20 so as to minimize local leakage. A metal cover 21 is provided to cover the trap patterns 19 so as to provide complete isolation and increase the resistance to disturbance.

A trap pattern 19 is connected to each of the bias line patterns 17 at a position spaced at a predetermined distance away from the associated signal pattern 15. The predetermined distance is substantially equal to $T\cdot\lambda/4$ where T is the periodicity of the high frequency signal to be processed and $\lambda$ is the wave length of the high frequency signal. Consequently, the bias voltages have no effect on the high frequency signal to be processed. The grounded patterns 16 are formed on the upper surface of the substrate 14, whereas the trap patterns 19 are formed on the lower surface of the substrate 14. It is, therefore, possible to ensure a high degree of freedom for layout design. This is effective to provide a higher density signal processing apparatus. It is to be understood that similar effects can be obtained by setting the predetermined distance at an odd number multiplied by $T\cdot\lambda/4$.

While the invention has been described in connection with a high frequency amplifier, it is to be understood that the invention is equally applicable to other apparatus for processing high frequency signals. While the invention has been described in conjunction with specific embodiments thereof, it is evident that many alternatives, modifications and variations will be apparent to those skilled in the art. Accordingly, it is intended to embrace all alternatives, modifications and variations that fall within the scope of the appended claims.

What is claimed is:

1. An apparatus for processing a high frequency signal having a periodicity T and a wave length λ, comprising:

a signal processor for processing the high frequency signal to produce a processed signal;

a dielectric substrate having first and second surfaces opposite to each other;

signal line patterns formed on the first surface of the dielectric substrate for communication of the high frequency signal;

a bias line pattern for biasing said signal processor and extending from each of the signal line patterns, the bias line pattern having a first portion formed on the first surface of the dielectric substrate, a second portion formed on the second surface of the dielectric substrate, and a conductor extending through the dielectric substrate for providing an electrical connection between the first and second portions of the bias line pattern;

a trap pattern formed on the second surface of the dielectric substrate and connected to the second portion of the bias line pattern at a position spaced a predetermined distance away from the corresponding one of the signal line patterns, the predetermined distance being substantially equal to an odd number multiplied by T·λ/4; and a grounded pattern formed on the first surface of the dielectric substrate.

2. The high frequency signal processing apparatus as claimed in claim 1, wherein the grounded pattern extends along a line on which the trap pattern is arranged.

3. The high frequency signal processing apparatus as claimed in claim 1, wherein the bias line pattern has a third portion formed on the first surface of the dielectric substrate, and a conductor extending through the dielectric substrate for providing an electrical connection between the second and third portions of the bias line pattern.

4. An apparatus for processing a high frequency signal having a periodicity T and a wave length λ, comprising:

a dielectric substrate having first and second surfaces opposite to each other;

at least one signal processor for processing the high frequency signal to produce a processed signal;

a first signal line pattern formed on the first surface of the dielectric substrate for coupling the high frequency signal to the signal processor;

a second signal line pattern formed on the first surface of the dielectric substrate for transmitting the processed signal from the signal processor;

a first bias line pattern for biasing the signal processor and extending from the first signal line pattern for coupling the first signal line pattern to a first bias voltage, the first bias line pattern having a first portion formed on the first surface of the dielectric substrate, a second portion formed on the second surface of the dielectric substrate, and a conductor extending through the dielectric substrate for providing an electrical connection between the first and second portions of the first bias line pattern;

a second bias line pattern for biasing said at least one signal processor extending from the second signal line pattern for coupling the second signal line pattern to a second bias voltage, the second bias line pattern having a fourth portion formed on the first surface of the dielectric substrate, a fifth portion formed on the second surface of the dielectric substrate, and a conductor extending through the dielectric substrate for providing an electrical connection between the fourth and fifth portions of the second bias line pattern;

a first trap pattern formed on the second surface of the dielectric substrate and connected to the second portion of the first bias line pattern at a position spaced a predetermined distance away from the first signal line pattern, the predetermined distance being substantially equal to an odd number multiplied by T·λ/4;

a second trap pattern formed on the second surface of the dielectric substrate and connected to the fifth portion of the second bias line pattern at a position spaced the predetermined distance away from the second signal line pattern; and a grounded pattern formed on the first surface of the dielectric substrate.

5. The high frequency signal processing apparatus as claimed in claim 4, wherein the grounded pattern extends along a line on which the first and second trap patterns are arranged.

6. The high frequency signal processing apparatus as claimed in claim 4, wherein the first bias line pattern has a third portion formed on the fist surface of the dielectric substrate, and a conductor extending through the dielectric substrate for providing an electrical connection between the second and third portions of the first bias line pattern, and wherein the second bias line pattern has a sixth portion formed on the first surface of the dielectric substrate, and a conductor extending through the dielectric substrate for providing an electrical connection between the fifth and sixth portions of the second bias line pattern.

7. The high frequency signal processing apparatus claimed in claim 4, wherein the grounded pattern is formed to surround the signal processor.

8. The high frequency signal processing apparatus claimed in claim 7, further comprising a shield casing placed on the grounded pattern to cover the signal processor.

* * * * *

UNITED STATES PATENT AND TRADEMARK OFFICE
CERTIFICATE OF CORRECTION

PATENT NO. : 5,248,950
DATED : September 28, 1993
INVENTOR(S) : Shozo Horisawa; Hiroyuki Mita It is certified that error appears in the above-indentified patent and that said Letters Patent is hereby corrected as shown below:

In the Abstract, line 18 , after "processed" insert --, respectively--

In the Claims:

Col. 6, line 12, after "processor" insert --and--
line 42, change "fist" to --first--

Signed and Sealed this

Fifth Day of July, 1994

Attest:

BRUCE LEHMAN

Attesting Officer

Commissioner of Patents and Trademarks